US012607489B2

(12) United States Patent
Matam et al.

(10) Patent No.: US 12,607,489 B2
(45) Date of Patent: Apr. 21, 2026

(54) FLOW DETECTION USING PIEZOELECTRIC FLEXURAL ELEMENT

(71) Applicant: Neptune Technology Group LLC, Wilmington, DE (US)

(72) Inventors: Mahesh Matam, Cumming, GA (US); Jeffrey M. Fowler, Lawrenceville, GA (US)

(73) Assignee: Neptune Technology Group LLC, Tallassee, AL (US)

( * ) Notice: Subject to any disclaimer, the term of this patent is extended or adjusted under 35 U.S.C. 154(b) by 264 days.

(21) Appl. No.: 18/509,475

(22) Filed: Nov. 15, 2023

(65) Prior Publication Data

US 2024/0167859 A1 May 23, 2024

Related U.S. Application Data

(60) Provisional application No. 63/384,780, filed on Nov. 23, 2022.

(51) Int. Cl.
| | |
|---|---|
| *G01F 1/54* | (2006.01) |
| *G01F 1/667* | (2022.01) |
| *H10N 30/00* | (2023.01) |
| *H10N 30/20* | (2023.01) |
| *G06Q 50/06* | (2012.01) |

(52) U.S. Cl.
CPC ............... *G01F 1/54* (2013.01); *G01F 1/667* (2013.01); *H10N 30/2046* (2023.02); *H10N 30/704* (2024.05); *G06Q 50/06* (2013.01)

(58) Field of Classification Search
CPC ... G01F 1/54; G01F 1/667; G01F 1/28; G01F 15/005; G01F 1/206; G01F 1/34; H10N 30/2046; H10N 30/704; G06Q 50/06; H01N 30/2042
USPC .... 73/861, 861.32, 202, 861.47, 48, 861.77, 73/262, 269; 116/112, 264, 270, 273; 340/606, 608, 610
See application file for complete search history.

(56) References Cited

U.S. PATENT DOCUMENTS

| | | | | |
|---|---|---|---|---|
| 2,561,763 | A | * | 7/1951 | Waters ................ G01P 13/0073 |
| | | | | 73/861.73 |
| 6,874,371 | B1 | | 4/2005 | Smith et al. |
| 7,058,521 | B2 | | 6/2006 | Kowal et al. |
| 7,311,001 | B2 | | 12/2007 | Liu et al. |
| 7,443,313 | B2 | | 10/2008 | Davis et al. |

(Continued)

FOREIGN PATENT DOCUMENTS

| | | | | |
|---|---|---|---|---|
| CA | 2130945 | C | * 12/1999 | ............... G01F 3/20 |
| CN | 116183093 | A | * 5/2023 | ............. G01L 13/06 |

(Continued)

*Primary Examiner* — Robert R Raevis
(74) *Attorney, Agent, or Firm* — Fish & Richardson P.C.

(57) ABSTRACT

A device and a method are described in which a flow detection service is provided. The service may include use of a piezoelectric flexural element. The piezoelectric flexural element may be disposed in an inlet, an outlet, or a passageway via which a resource may flow. The piezoelectric flexural element may output a signal responsive to a transition from a zero-flow rate to a greater than zero flow rate of the resource traversing the inlet, the passageway, and the outlet. The flow detection service may be implemented in a meter. The flow detection service may enable significant reduction of battery usage and at a low cost.

21 Claims, 9 Drawing Sheets

(56)                References Cited

U.S. PATENT DOCUMENTS

| | | | |
|---|---|---|---|
| 7,904,268 | B2 | 3/2011 | Wheeler et al. |
| 8,091,434 | B2 | 1/2012 | Vaidya |
| 8,132,469 | B2 | 3/2012 | Allen |
| 8,181,534 | B2 | 5/2012 | Allen |
| 8,186,229 | B2 | 5/2012 | Allen |
| 8,201,462 | B2 | 6/2012 | Vaidya |
| 8,279,080 | B2 | 10/2012 | Pitchford et al. |
| 8,939,016 | B2 | 1/2015 | Brasel et al. |
| 8,994,551 | B2 | 3/2015 | Pitchford et al. |
| 9,105,181 | B2 | 8/2015 | Pitchford et al. |
| 9,222,813 | B2 | 12/2015 | Kono et al. |
| 9,295,923 | B2 | 3/2016 | Mezheritsky et al. |
| 9,508,915 | B2 | 11/2016 | Oscarsson |
| 9,651,400 | B2 | 5/2017 | Pitchford et al. |
| 9,928,724 | B2 | 3/2018 | Alcorn et al. |
| 10,229,579 | B2 | 3/2019 | Alcorn et al. |
| 10,506,307 | B2 | 12/2019 | Adler et al. |
| 10,750,253 | B2 | 8/2020 | Adler et al. |
| 10,830,625 | B2 | 11/2020 | Skallebaek et al. |
| 10,942,051 | B2 | 3/2021 | Buehler |
| 11,047,115 | B2 | 6/2021 | Brotherton et al. |
| 11,095,960 | B2 | 8/2021 | Klicpera et al. |
| 11,287,311 | B2 | 3/2022 | Forster-Knight et al. |
| 2007/0137936 | A1* | 6/2007 | Akechi ............... G01P 13/0033 |
| | | | 184/14 |
| 2017/0248458 | A1* | 8/2017 | Yusuf ..................... G01F 1/662 |
| 2018/0313714 | A1 | 11/2018 | Bailey |
| 2019/0234786 | A1 | 8/2019 | Klicpera |
| 2020/0165801 | A1 | 5/2020 | Crawford |
| 2020/0326216 | A1 | 10/2020 | Sarkissian et al. |
| 2021/0079630 | A1 | 3/2021 | Poojary et al. |
| 2021/0381207 | A1 | 12/2021 | Brotherton et al. |

FOREIGN PATENT DOCUMENTS

| | | | | | |
|---|---|---|---|---|---|
| EP | | 3667255 | A1 * | 6/2020 | .......... G01F 1/3266 |
| WO | WO-2023028324 | A1 * | | 3/2023 | .......... G01N 29/024 |

* cited by examiner

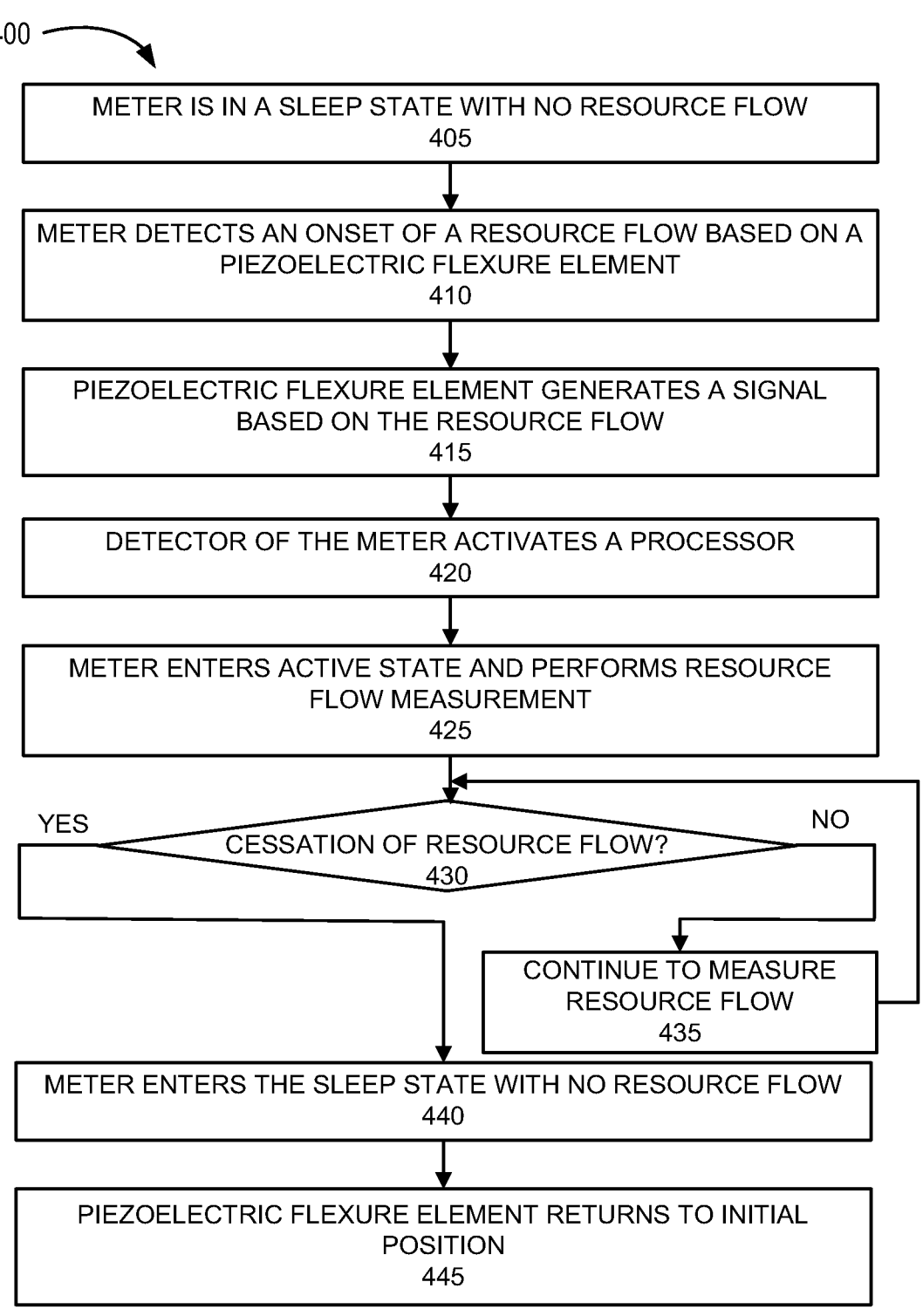

400

METER IS IN A SLEEP STATE WITH NO RESOURCE FLOW
405

METER DETECTS AN ONSET OF A RESOURCE FLOW BASED ON A
PIEZOELECTRIC FLEXURE ELEMENT
410

PIEZOELECTRIC FLEXURE ELEMENT GENERATES A SIGNAL
BASED ON THE RESOURCE FLOW
415

DETECTOR OF THE METER ACTIVATES A PROCESSOR
420

METER ENTERS ACTIVE STATE AND PERFORMS RESOURCE
FLOW MEASUREMENT
425

YES          CESSATION OF RESOURCE FLOW?          NO
430

CONTINUE TO MEASURE
RESOURCE FLOW
435

METER ENTERS THE SLEEP STATE WITH NO RESOURCE FLOW
440

PIEZOELECTRIC FLEXURE ELEMENT RETURNS TO INITIAL
POSITION
445

Fig. 4

FLOW DETECTION USING PIEZOELECTRIC FLEXURAL ELEMENT

CROSS-REFERENCE TO RELATED APPLICATION

This patent application claims priority under 35 U.S.C. § 119, based on U.S. Provisional Application No. 63/384,780, filed Nov. 23, 2022, the disclosure of which is hereby incorporated by reference herein.

BACKGROUND

Utility companies and other entities operate distribution systems for various resources (e.g., water, gas, electricity, chemicals, etc.) to deliver these resources to customers connected to the distribution systems. A meter may be used at each point where the resource is removed and/or provided from the distribution system to a customer to measure usage. Each meter includes or is coupled to a radio transmitter that has an integral or external antenna. Many metering systems use wireless communications to report meter readings to a backend system via a communication network.

BRIEF DESCRIPTION OF THE DRAWINGS

FIG. 4 is a diagram illustrating an exemplary process of an exemplary embodiment of the flow detection service.

DETAILED DESCRIPTION OF PREFERRED EMBODIMENTS

Figure 1A:
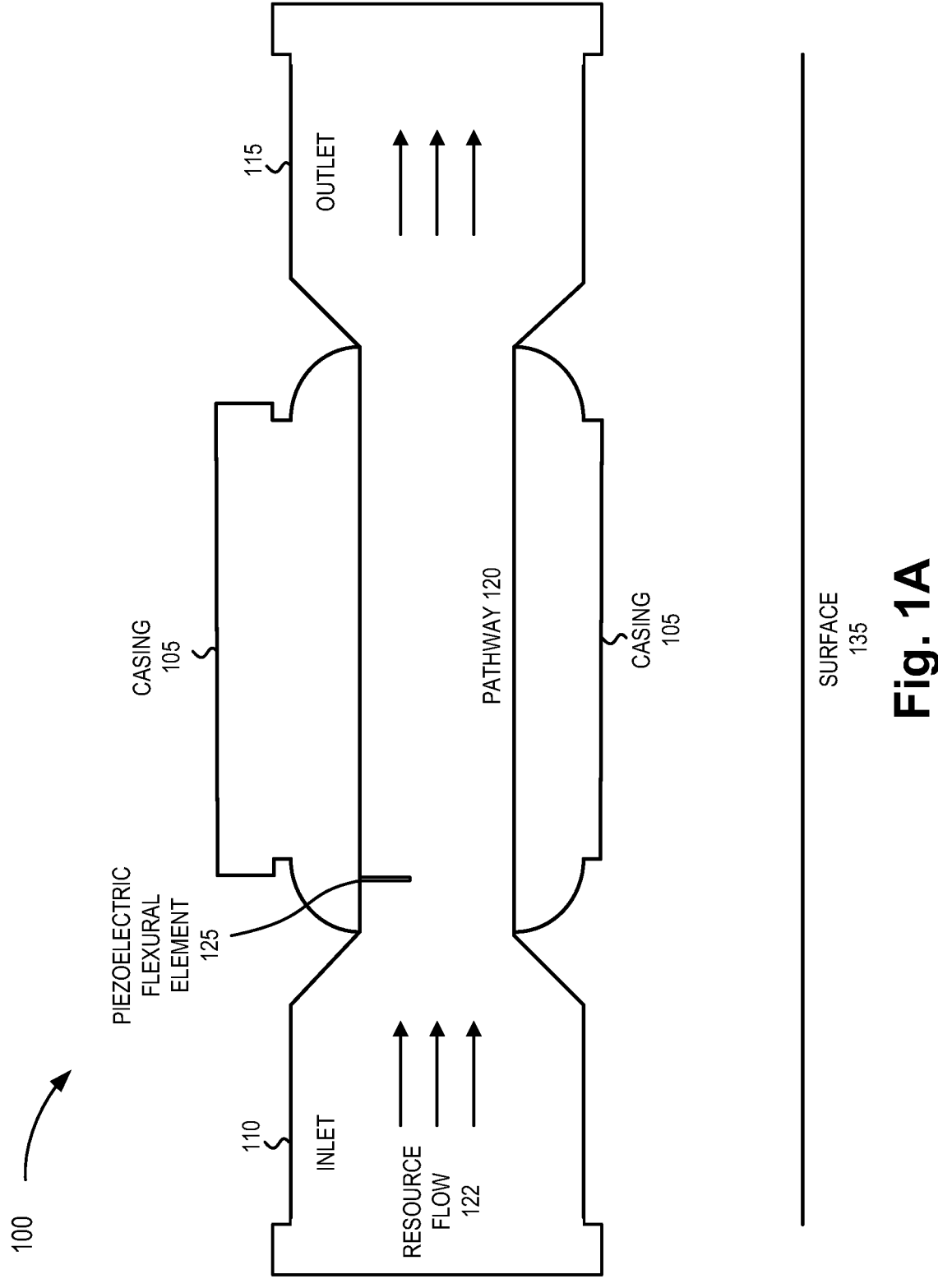
FIGS. 1A-1E are diagrams illustrating exemplary embodiments of the flow detection service.

The following detailed description refers to the accompanying drawings. The same reference numbers in different drawings may identify the same or similar elements. Also, the following detailed description does not limit the invention.

Meters that measure usage of a resource, such as a utility resource (e.g., water, gas, electricity, etc.) or another type of resource (e.g., chemical, etc.) are widely used. Further, meters have been combined with electronic components to facilitate communication between the meters and backend systems via a network. For example, a meter interface unit (MIU) may include a transmitter that is configured to wirelessly transmit usage information and other information (e.g., leak information, reverse flow detection, etc.). The MIU may also include a receiver that is configured to wirelessly receive information and commands. The meter and the MIU may be a part of an automated meter reading (AMR) system, such as an AMR system associated with a water utility company, an advanced metering system (AMS), an advanced meter infrastructure (AMI), or another type of architecture associated with a utility company or another entity.

Among the many features of the meter, flow detection is an important aspect of the operation of the meter. For example, flow detection of water may relate to various characteristics, such as direction of flow and/or a flow rate of the flow. For the meter that is powered by a battery, for example, flow detection can drain the battery because flow detection may be an ever-ongoing process regardless of whether or not there is a flow. The design for flow detection includes various considerations including cost, configurations associated with a flow sensor, and power consumption associated with the flow sensor.

According to exemplary embodiments, a flow detection service is described. According to an exemplary embodiment, a meter includes the flow detection service. According to an exemplary embodiment, the flow detection service includes the use of a piezoelectric flexural or bending element (simply referred to as a "piezoelectric flexural element") and a detector circuit. The piezoelectric flexural element may be disposed in various locations of a path via which the resource may flow, as described herein. For example, the piezoelectric flexural element may be affixed to an inner wall of an inlet, an inner wall of an outlet, or an inner wall of a pathway between the inlet or the outlet of a water meter. According to an exemplary embodiment, the piezoelectric flexural element may be affixed at one end to an internal wall of the meter and another end of the piezoelectric flexural element may be free (e.g., not affixed). According to an exemplary embodiment, there may be a single piezoelectric flexural element. According to other exemplary embodiments, this may not be the case.

According to an exemplary process, the piezoelectric flexural element may be situated in a free state when there is no flow of a resource (e.g., water, etc.) in the meter. When the resource starts flowing, the piezoelectric flexural element is elastically deflected, which causes the piezoelectric flexural element to generate and output an electrical pulse. The electrical pulse may activate the detector circuit and trigger a processor. The processor may cause the meter to transition from an inactive state to an active state that includes measurement of the resource flow at a configurable sampling rate. When the resource stops flowing, the piezoelectric flexural element may return to its free state and the processor may detect the cessation of the resource flow. In response, the processor may return the meter to the inactive state. While in the inactive state, flow detection may still occur at a significantly reduced sampling rate (e.g., relative to a sampling rate associated with normal flow detection).

As a result, during the time the meter is in an inactive state and/or operating with a reduced sampling rate, its power consumption may be significantly reduced. For example, in some instances, the power savings may be up to about 95% power reduction. Consequently, the flow detection service may significantly increase the battery life of a battery associated with the meter. Additionally, in contrast to other flow detection approaches, the flow detection service may include use of the piezoelectric flexural element incorporated in a simplified configuration and with minimal cost.

FIG. 1A is a diagram of an exemplary meter 100 that provides an exemplary embodiment of the flow detection service. As illustrated, meter 100 may include a casing 105, an inlet 110, an outlet 115, and a pathway 120. As further illustrated, meter 100 includes a piezoelectric flexural element 125. As described herein, according to various exemplary embodiments, piezoelectric flexural element 125 may be positioned in different locations that are in a path of a resource flow 122. According to an exemplary embodiment, as depicted, piezoelectric flexural element 125 may be positioned in pathway 120.

A surface 135 is depicted to show one possible orientation of meter 100, such as being parallel or horizontal relative to surface 135. For example, surface 135 may be a customer's yard, a floor in a building or house, and so forth. However, according to other exemplary embodiments, meter 100 may be oriented differently, such as being vertical or perpendicular to surface 135, or another orientation. In this regard, the position and location of piezoelectric flexural element 125 (and other parts of meter 100) may be different according to other exemplary embodiments. As one example, although piezoelectric flexural element 125 is depicted as affixed to a top wall of pathway 120 in FIG. 1A, according to other exemplary embodiments, piezoelectric flexural element 125 may be affixed to a bottom wall of pathway 120, a bottom wall of inlet 110, a bottom wall of outlet 115, and so forth.

Casing 105 may be a housing that encases various elements of meter 100. Inlet 110 and outlet 115 may operate as an input and an output, respectively, relative to a flow of a resource, such as water, for example. Pathway 120 may provide a passageway between inlet 110 and outlet 115. Inlet 110, outlet 115, and pathway 120 may be implemented as a unitary piece.

According to an exemplary embodiment, piezoelectric flexural element 125 may be implemented as a polyvinylidene fluoride (PVDF) film or similar type of piezoelectric polymer film. In further exemplary embodiments, piezoelectrical flexural element 125 may be implemented as a lead zirconate titanate (PZT)-based flexural bimorph. PZT-based bimorphs may have piezoelectric properties that may induce significant signal outputs for low flow velocities. As an example, a PZT-based bimorph may include two PZT rectangular elements separated by a thin metal sheet for compliance. According to some exemplary embodiments, piezoelectric flexural element 125 may have a thickness from about 0.003 inches to about 0.010 inches. Piezoelectric flexural element 125 may be rectangular shaped or another suitable form factor to enable flow detection of the resource, as described herein.

According to an exemplary embodiment, piezoelectric flexural element 125 may be affixed at one end to an inner wall of meter 100. For example, piezoelectric flexural element 125 may be affixed using an epoxy, a clamp, or another suitable adhesive or fixing element. As illustrated in FIG. 1A, an opposite end of piezoelectric flexural element 125 may be unaffixed, which enables piezoelectric flexural element 125 to freely move. Referring to FIG. 2A, piezoelectric flexural element 125 is illustrated from an exemplary side view 202 and an exemplary front view 204. Piezoelectric flexural element 125 includes wires 203 that may be connected to a detector circuit (not illustrated), as described herein. For front view 204, a resource flow facing side 207 is referenced. In FIGS. 1A-1E, piezoelectric flexural element 125 is shown from side view 202.

The dimensions of piezoelectric flexural element 125 may depend on the size and shape of the surrounding space internal to meter 100. For example, referring to FIGS. 1A and 2A, pathway 120 may be tubular or cylindrical in shape and a length 205 of piezoelectric flexural element 125 may range from substantially equal to or less than a length of a radius (or center to inner wall) of pathway 120. According to some exemplary implementations, piezoelectric flexural element 125 may be configured with a particular length/width (L/W) aspect ratio (e.g., about 1.25 or about 1.6) which may maximize the output of piezoelectric flexural element 125 in view of the dimensions of pathway 120.

Figure 2A:
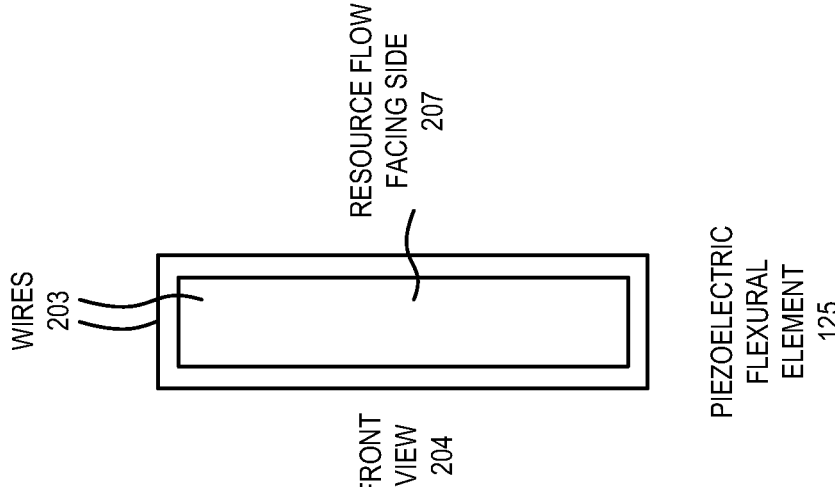
FIG. 2A is a diagram illustrating exemplary piezoelectric flexural element.
Figure 2A:
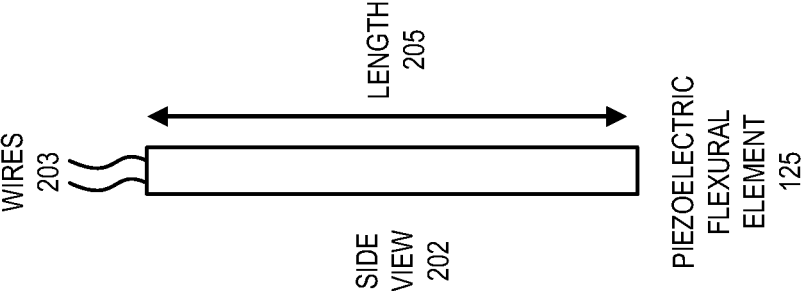
Figure 2B:
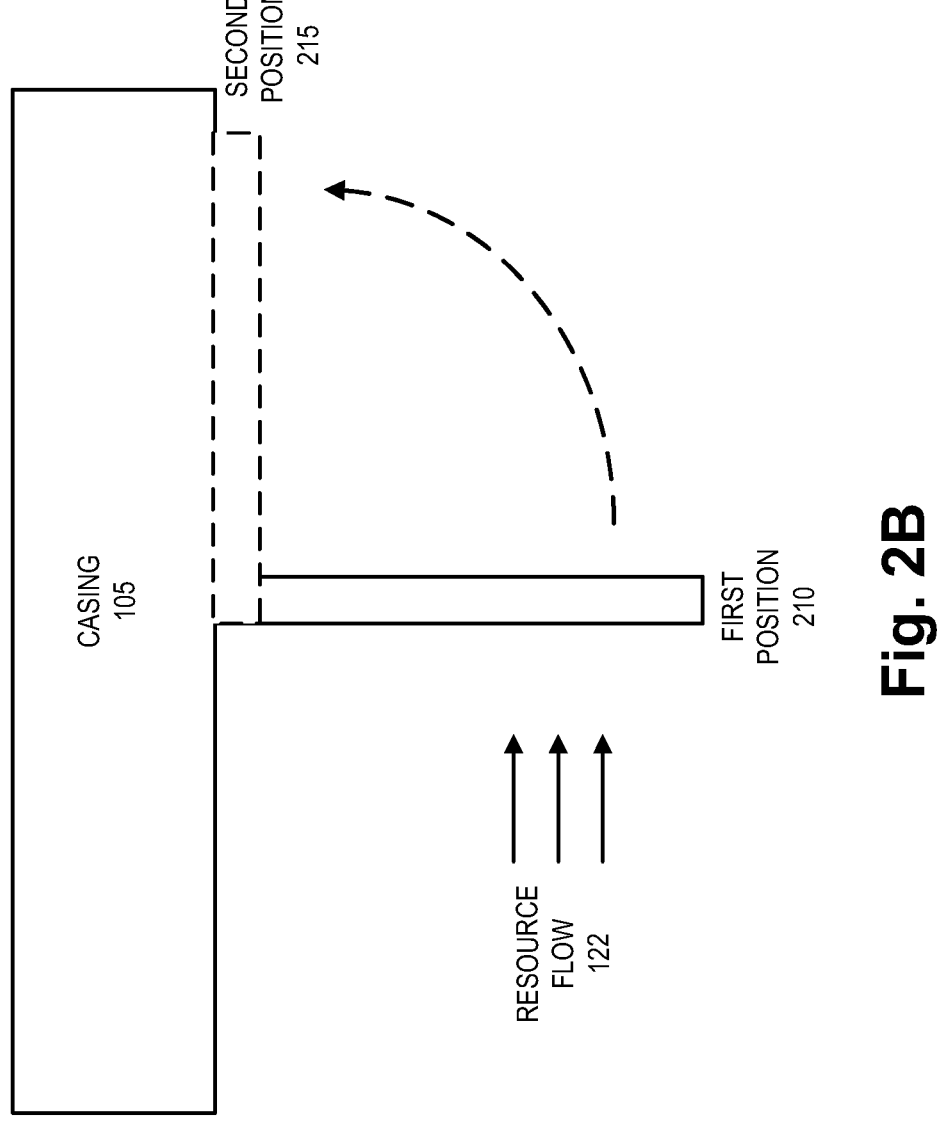
FIG. 2B is a diagram illustrating an exemplary process associated with the piezoelectric flexural element.

Referring to FIG. 2B, according to an exemplary scenario, when there is no active flow of the resource, piezoelectric flexural element 125 may be in a first position 210. For example, piezoelectric flexural element 125 may be oriented substantially perpendicular to an inner wall. During the onset and progression of an increasing rate of flow of the resource, piezoelectric flexural element 125 may move toward and eventually rest on an inner wall of meter 100, depicted as a second position 215. Concurrently, piezoelectric flexural element 125 may flex (or bend), which may induce a charge and/or voltage due to the piezoelectric properties of piezoelectric flexural element 125. Although not shown, when the flow of the resource stops, piezoelectric flexural element 125 may return to first position 210.

Figure 1B:
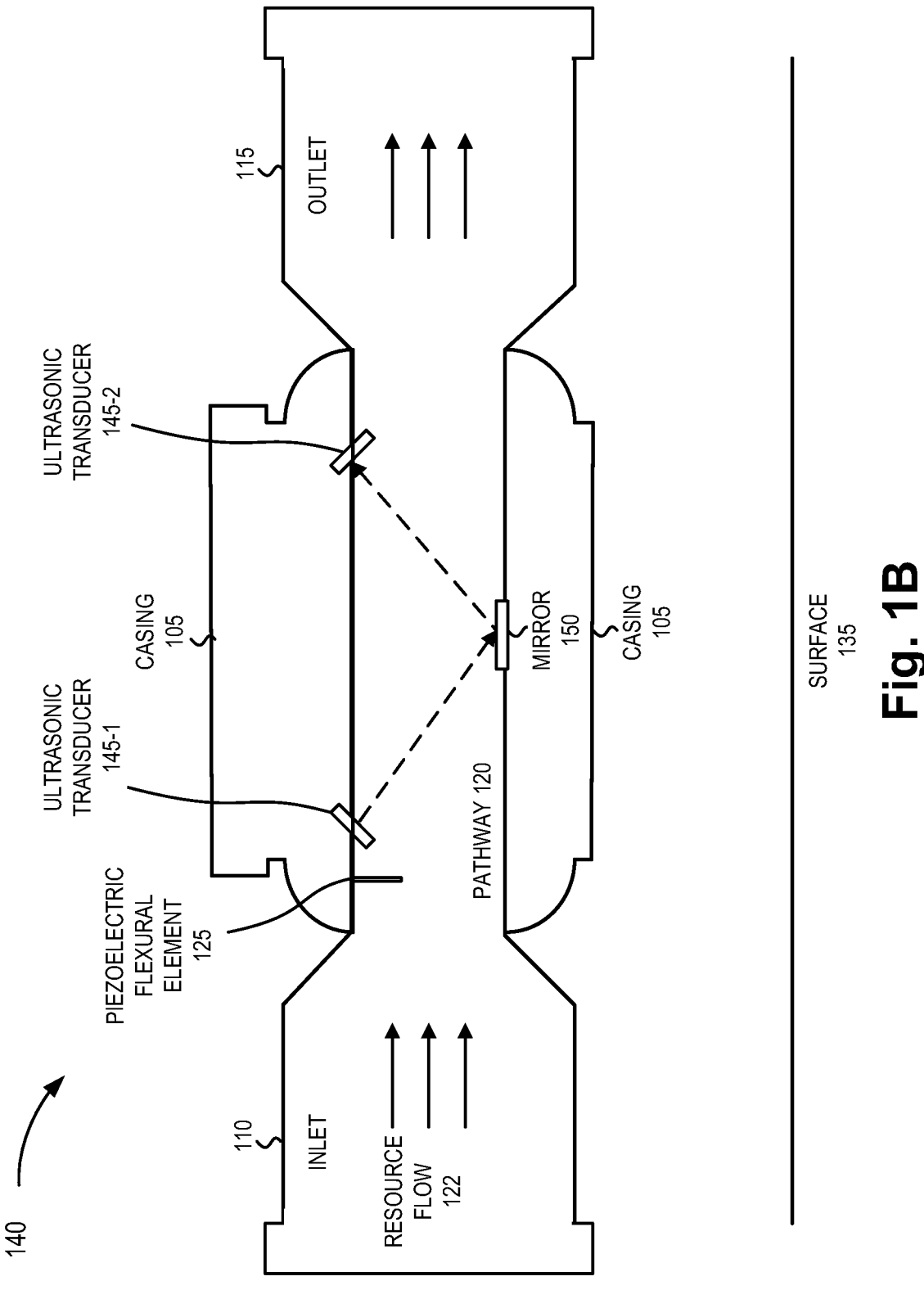

FIGS. 1B-1E illustrate other exemplary embodiments of the flow detection service of meter 100. Referring to FIG. 1B, piezoelectric flexural element 125 may be disposed between inlet 110 and ultrasonic transducers 145-1 and 145-2 (also referred to as ultrasonic transducers 145, and individually or generally as ultrasonic transducer 145). The number and arrangement of ultrasonic transducers 145 is merely exemplary. A mirror 150 may be used for flow detection by ultrasonic transducers 145 during normal flow detection. Mirror 150 may be implemented as a steel mirror or another suitable material. Mirror 150 may be flat, concave, or another configuration. According to an exemplary process, after the flow of the resource is detected based on piezoelectric flexural element 125, meter 100 may use ultrasonic transducers 145 to make flow measurements, as described herein. Ultrasonic transducers 145 and mirror 150 are not illustrated in FIGS. 1A and 1C-1E for simplicity.

Figure 1C:
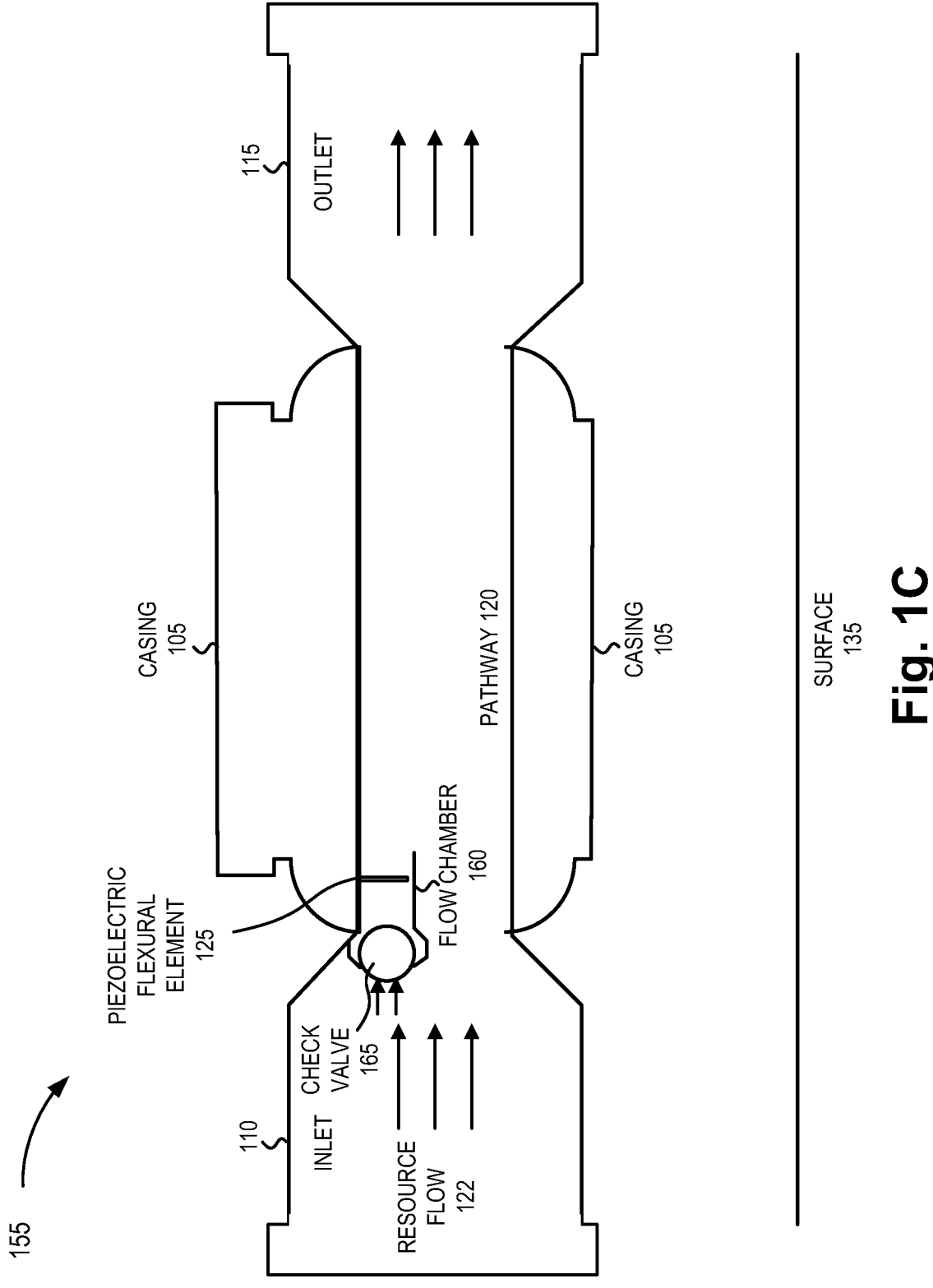

Referring to FIG. 1C, according to an exemplary embodiment, piezoelectric flexural element 125 may be disposed in a flow chamber 160. For example, flow chamber 160 may be implemented to include a check valve 165. For example, check valve 165 may be disposed in the entrance way of flow chamber 160 (or other suitable position associated with flow chamber 160) such that check valve 165 may prevent the resource flow through the chamber and/or prevent the resource flow (and associated velocity) from damaging piezoelectric flexural element 125. According to an exemplary process, when a certain flow rate of the resource is reached, check valve 165 may close and assist in protecting the integrity of piezoelectric flexural element 125. Check valve 165 may open when the flow rate of the resource subsides. According to other exemplary embodiments, flow chamber 160 and check valve 165 may be disposed elsewhere in meter 100 in correspondence to other locations for piezoelectric flexural element 125, as described herein.

Figure 1D:
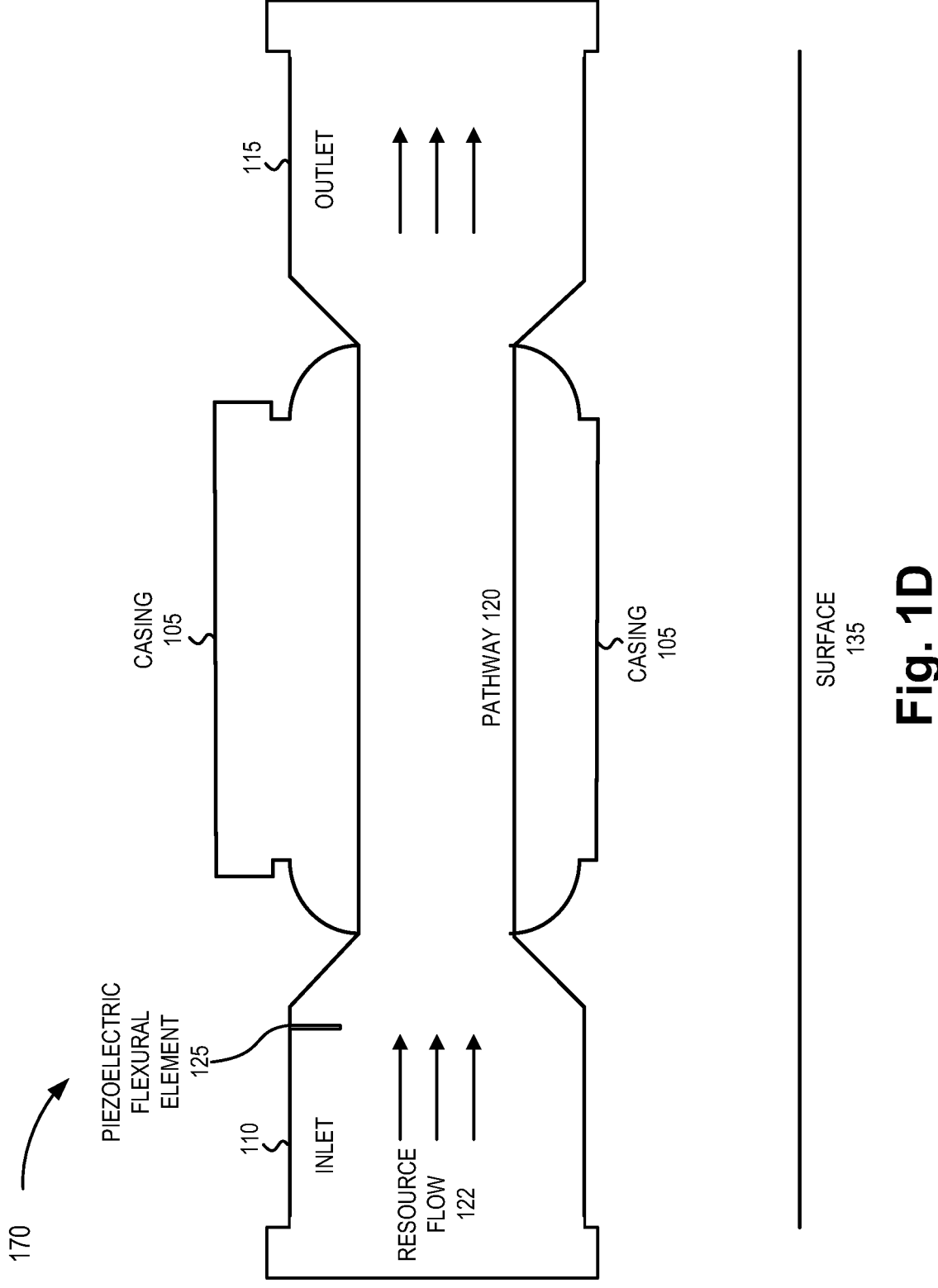
Figure 1E:
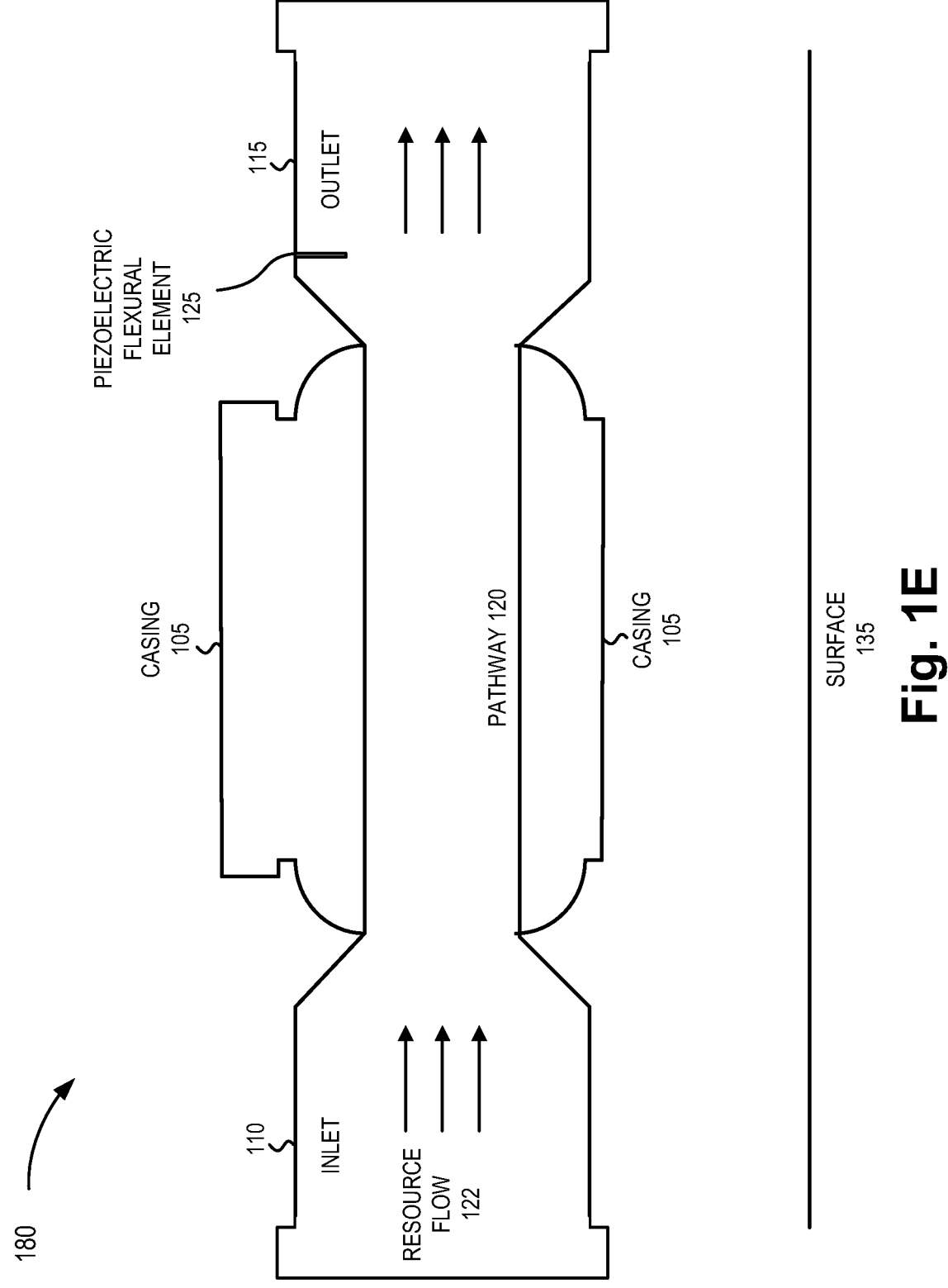

Referring to FIG. 1D, according to an exemplary embodiment, piezoelectric flexural element 125 may be disposed in inlet 110, or according to yet another exemplary embodiment, piezoelectric flexural element 125 may be disposed in outlet 115, as illustrated in FIG. 1E.

While FIGS. 1A-1E include exemplary configurations, locations, and positions of piezoelectric flexural element 125, according to other exemplary embodiments, piezoelectric flexural element 125 may be implemented in configurations, locations, and positions not specifically illustrated. For example, piezoelectric flexural element 125 may be disposed in inlet 110 or outlet 115 relative to ultrasonic transducers 145 situated in pathway 120. Additionally, as previously described, while piezoelectric flexural element 125 has been illustrated as disposed on a top wall of inlet 110, pathway 120, or outlet 115, piezoelectric flexural element 125 may be disposed on another wall (e.g., bottom, side, etc.) or radial position associated with inlet 110, pathway 120, or outlet 115.

For purposes of description, although not illustrated in FIGS. 1A-1E, meter 100 may include other components or elements, such as a processor or a controller, a detector circuit, an MIU, an antenna, a power source (e.g., a battery), and so forth. According to an exemplary embodiment, meter 100 may be a water meter. According to another exemplary embodiment, meter 100 may be another type of meter. According to still another exemplary embodiment, another type of apparatus may include the flow detection service.

Figure 3:
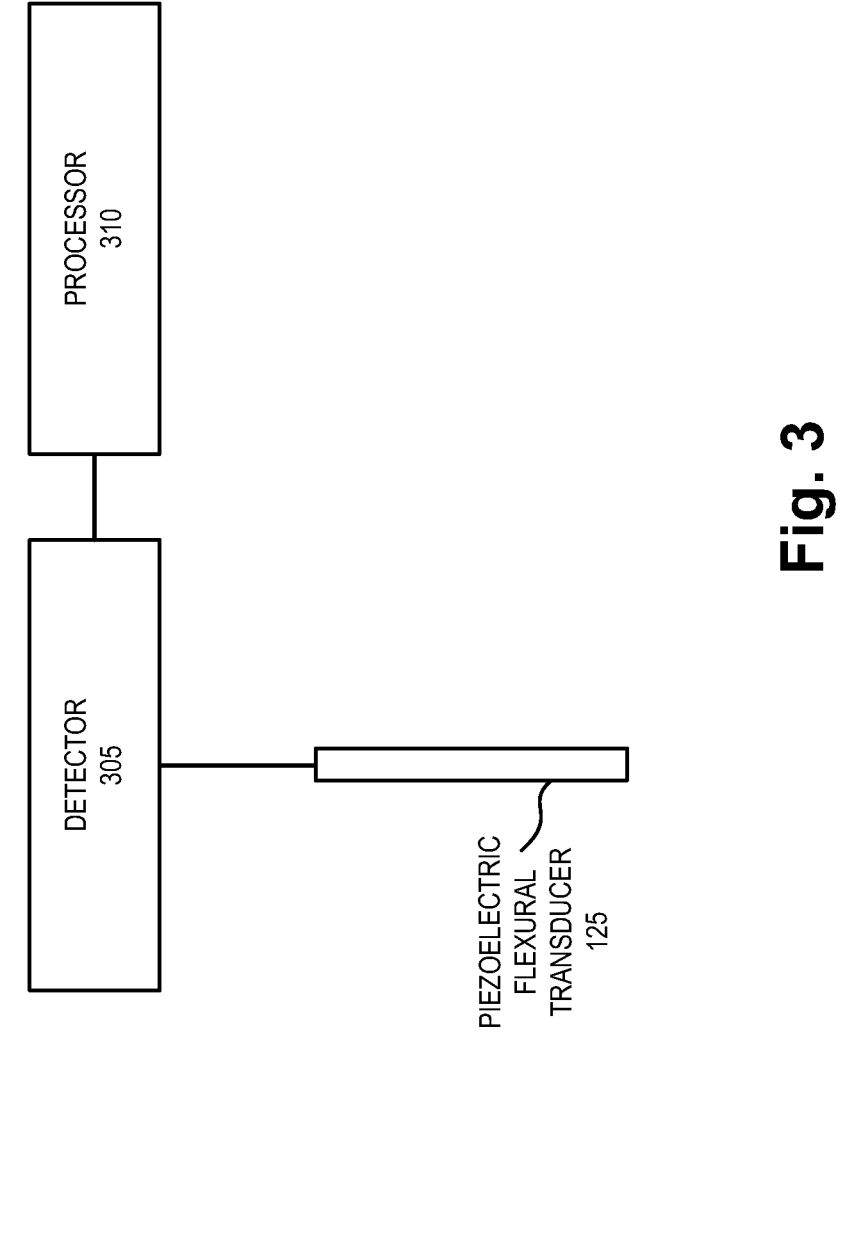
FIG. 3 is a diagram illustrating exemplary components of a device that provides an exemplary embodiment of the flow detection service.

FIG. 3 is a diagram illustrating some exemplary components of meter 100. For example, meter 100 may include piezoelectric flexural element 125, a detector 305, and a processor 310. Detector 305 may include a component that detects an output from piezoelectric flexural element 125. For example, based on the force of the resource flow (e.g., resource flow 122) on piezoelectric flexural element 125, piezoelectric flexural element 125 may generate a voltage that is output to detector 305.

Detector 305 may be implemented as a D latch, an S-R latch, or a similar type of digital circuit, for example. In response to receiving the electrical signal from piezoelectric flexural element 125, detector 305 may output a signal to processor 310. For example, an electrical signal above a threshold amplitude may cause processor 310 to wake up. The threshold amplitude may be set depending on operating conditions, such as meter size, desired sensitivity, orientation relative to surface 135, or other information available to any component of meter 100. The threshold amplitude may further be adjusted based on a calibration.

Processor 310 may be implemented as a microprocessor, a microcontroller, and/or another type of logic or circuitry (e.g., a field-programmable gate array (FPGA), an application specific integrated circuit (ASIC), etc.) that interprets and executes one or more processes/functions. In response to receiving the electrical signal from detector 305, processor 310 may cause meter 100 to enter an active state and cause a flow sensor to measure the flow of the resource. For example, processor 310 may cause ultrasonic transducers or another suitable flow measurement mechanism to measure the resource flow. A sampling rate during the active state may be increased relative to when meter 100 is in an inactive state. During this time, meter 100 may expend more battery usage relative to when meter 100 is in the inactive state. Once the flow of the resource stops, piezoelectric flexural element 125 may return to its initial state (e.g., first position 210). Processor 310 may detect the cessation of the resource flow, and in response, processor 310 may return meter 100 to the inactive state in which battery usage is minimal. The sampling rate may return to sleep state rate.

FIG. 4 is a flow diagram illustrating an exemplary process 400 of an exemplary embodiment of the flow detection service. According to an exemplary embodiment, meter 100 may perform, in whole or in part, steps of process 400. According to an exemplary implementation, processor 310 may execute software to perform a step illustrated and described in relation to FIG. 4. Alternatively, a step illustrated in FIG. 4, and described herein, may be performed by execution of only hardware.

Referring to FIG. 4, in block 405, a meter may be in a sleep or inactive state in which there is no flow of a resource. For example, a water meter may enter the sleep state when there is no flow of water via an inlet and an outlet of the water meter. As described herein, a piezoelectric flexural element may be in an initial state in which one end is affixed to an internal wall of the water meter and an opposite end of the piezoelectric flexural element is not affixed. According to some exemplary embodiments, the meter may operate with a reduced sampling rate for flow detection. As an example, the sampling rate may be about 0.2 Hz or another suitably low sampling rate such that battery usage may be significantly minimal.

In block 410, the meter may detect an onset of a resource flow based on the piezoelectric flexural element. For example, during the transition of a zero-flow rate to a greater than zero flow rate, the piezoelectric flexural element may be subjected to the force of the resource flow, which may cause the piezoelectric flexural element to flex or elastically deflect.

In block 415, the piezoelectric flexural element may generate a signal based on the resource flow. For example, based on the flexing of the piezoelectric flexural element and when the rate of change in the flow rate is significant enough, the piezoelectric flexural element may generate and output a signal (e.g., an electrical pulse). The signal may be output to a detector circuit.

In block 420, a detector of the meter may activate a processor of the meter. For example, responsive to the detection of the signal from the piezoelectric flexural element, the detector may activate the processor.

In block 425, the meter may enter an active state and perform resource flow measurement. For example, based on the activation of the processor, the meter may use any known mechanisms to measure the resource flow (e.g., ultrasonic transducers, etc.). According to some exemplary embodiments, the piezoelectric flexural element may, based on the resource flow, lay or rest on an internal wall of the meter (e.g., second position 215). According to other exemplary embodiments, as previously described, check valve 165 may close (e.g., a flap) based on a rate of flow to prevent the resource flow from damaging the piezoelectric flexural element. Additionally, relative to the sleep state of the meter, battery usage in the active state may increase and the sampling rate may increase. As an example, the sampling rate may be about 4 Hz or another suitable sampling rate to effectively measure the resource usage traversing the inlet and outlet of the meter.

In block 430, the meter may determine whether there is a cessation of the resource flow. When the meter determines that there is not a cessation of the resource flow (block 430-NO), the meter may continue to measure the resource flow (block 435) and return to block 430. When the meter determines that there is a cessation of the resource flow (block 430-YES), the meter may enter the sleep or inactive state with no resource flow (block 440).

In block 445, the piezoelectric flexural element may return to its initial position.

FIG. 4 illustrates an exemplary process 400 of the flow detection service, however, according to other embodiments, process 400 may include additional operations, fewer operations, and/or different operations than those illustrated in FIG. 4 and described herein.

As set forth in this description and illustrated by the drawings, reference is made to "an exemplary embodiment," "an embodiment," "embodiments," etc., which may include a particular feature, structure or characteristic in connection with an embodiment(s). However, the use of the phrase or term "an embodiment," "embodiments," etc., in various places in the specification does not necessarily refer to all embodiments described, nor does it necessarily refer to the same embodiment, nor are separate or alternative embodiments necessarily mutually exclusive of other embodiment(s). The same applies to the term "implementation," "implementations," etc.

The foregoing description of embodiments provides illustration but is not intended to be exhaustive or to limit the embodiments to the precise form disclosed. Accordingly, modifications to the embodiments described herein may be possible. For example, various modifications and changes may be made thereto, and additional embodiments may be implemented, without departing from the broader scope of the invention as set forth in the claims that follow. The description and drawings are accordingly regarded as illustrative rather than restrictive.

The terms "a," "an," and "the" are intended to be interpreted to include one or more items. Further, the phrase "based on" is intended to be interpreted as "based, at least in part, on," unless explicitly stated otherwise. The term "and/or" is intended to be interpreted to include any and all combinations of one or more of the associated items. The word "exemplary" is used herein to mean "serving as an example." Any embodiment or implementation described as "exemplary" is not necessarily to be construed as preferred or advantageous over other embodiments or implementations.

Embodiments described herein may be implemented in many different forms of software executed by hardware. For example, a process or a function may be implemented as "logic," a "component," or an "element." The logic, the component, or the element, may include, for example, hardware (e.g., processor 310, etc.), or a combination of hardware and software.

Embodiments have been described without reference to the specific software code because the software code can be designed to implement the embodiments based on the description herein and commercially available software design environments and/or languages. For example, various types of programming languages including, for example, a compiled language, an interpreted language, a declarative language, or a procedural language may be implemented.

Use of ordinal terms such as "first," "second," "third," etc., in the claims to modify a claim element does not by itself connote any priority, precedence, or order of one claim element over another, the temporal order in which acts of a method are performed, the temporal order in which instructions executed by a device are performed, etc., but are used merely as labels to distinguish one claim element having a certain name from another element having a same name (but for use of the ordinal term) to distinguish the claim elements.

Spatially relative terms, such as "beneath," "below," "lower," "above," "upper," "top", "bottom" and the like, may be used herein for ease of description to describe one element's or feature's relationship to another element or feature as illustrated in the figures. The spatially relative terms are intended to encompass different orientations of the device in use or operation, in addition to the use or the operation depicted in the figures. For example, if the device in the figure is turned over, an element described as "below" or "beneath" another element or another feature would then be oriented "above" the other element or the other feature. Thus, the exemplary terms "below" or "beneath" may encompass both an orientation of above and below depending on the orientation of the device. In the instance that the device may be oriented in a different manner (e.g., rotated at 90 degrees or at some other orientation), the spatially relative terms used herein should be interpreted accordingly.

The terms "about" and "approximately" shall generally mean an acceptable degree of error or variation for the quantity measured given the nature or precision of the measurements. Typical, exemplary degrees of error or variation are within 20 percent (%), preferably within 10%, and more preferably within 5% of a given value or range of values. Numerical quantities given in this description are approximate unless stated otherwise, meaning that the term "about" or "approximately" can be inferred when not expressly stated. The term "substantially" is used herein to represent the inherent degree of uncertainty that may be attributed to any quantitative comparison, value, measurement, or other representation. The term "substantially" is also used herein to represent the degree by which a quantitative representation may vary from a stated reference without resulting in a change in the basic function of the subject matter at issue.

Additionally, embodiments described herein may be implemented as a non-transitory computer-readable storage medium that stores data and/or information, such as instructions, software, firmware, microcode, source code, object code, program code, a data structure, a program module, an application, a script, or other known or conventional form suitable for use in a computing environment. The program code, instructions, application, etc., is readable and executable by a processor (e.g., processor 310) of a device, such as a meter.

No element, act, or instruction set forth in this description should be construed as critical or essential to the embodiments described herein unless explicitly indicated as such.

All structural and functional equivalents to the elements of the various aspects set forth in this disclosure that are known or later come to be known to those of ordinary skill in the art are expressly incorporated herein by reference and are intended to be encompassed by the claims.

What is claimed is:

1. A meter comprising:
an inlet;
an outlet;
a passageway between the inlet and the outlet;
a piezoelectric flexural element, wherein a first end of the piezoelectric flexural element is affixed to an inner wall of one of the inlet, the outlet, or the passageway, and wherein the piezoelectric flexural element is configured to output an electrical signal responsive to a change in flow rate of a resource traversing the inlet, the passageway, and the outlet;
a flow detection sensor; and
a processor, wherein the processor is configured to:
transition the meter from a sleep state to an active state based on the electrical signal; and
cause measurement of a flow of the resource by the flow detection sensor.

2. The meter of claim 1, wherein the change in the flow rate comprises a transition from a zero flow rate to a greater-than-zero flow rate.

3. The meter of claim 1, further comprising:
a detector circuit, and wherein the detector circuit is configured to receive the electrical signal, and in response, activate the processor.

4. The meter of claim 1, wherein the processor is further configured to:
increase a sampling rate from a first sampling rate of flow detection associated with the sleep state to a second sampling rate of flow detection associated with the active state.

5. The meter of claim 1, wherein the flow detection sensor includes ultrasonic transducers.

6. The meter of claim 1, wherein the piezoelectric flexural element is a polyvinylidene fluoride (PVDF) film.

7. The meter of claim 1, wherein a second end of the piezoelectric flexural element, opposite the first end of the piezoelectric flexural element, is unaffixed, thereby enabling the piezoelectric flexural element to elastically deflect.

8. The meter of claim 1, wherein the piezoelectric flexural element is enclosed in a check valve.

9. The meter of claim 1, wherein the meter is a water meter and the resource is water.

10. The meter of claim 1, wherein the piezoelectric flexural element projects perpendicularly from the inner wall into the resource.

11. A method comprising:

receiving, by a meter including an inlet, an outlet, and a passageway between the inlet and the outlet, a resource; and detecting, by the meter including a piezoelectric flexural element, which is affixed to an inner wall of one of the inlet, the outlet, or the passageway, change in flow rate of the resource traversing the inlet, the passageway, and the outlet, based on an electrical signal output by the piezoelectric flexural element;

transitioning the meter from a sleep state to an active state based on the electrical signal; and causing measurement of a flow of the resource.

12. The method of claim 11, wherein the change in the flow rate comprises a transition from a zero flow rate to a greater-than-zero flow rate.

13. The method of claim 11, further comprising: activating a processor of the meter based on the electrical signal.

14. The method of claim 11, further comprising: increasing a sampling rate from a first sampling rate of flow detection associated with the sleep state to a second sampling rate of flow detection associated with the active state.

15. The method of claim 11, wherein the piezoelectric flexural element is a polyvinylidene fluoride (PVDF) film.

16. The method of claim 11, wherein a first end of the piezoelectric flexural element is affixed to the inner wall, and a second end of the piezoelectric flexural element, opposite the first end of the piezoelectric flexural element is unaffixed, thereby enabling the piezoelectric flexural element to elastically deflect.

17. The method of claim 11, wherein the piezoelectric flexural element is enclosed in a check valve.

18. The method of claim 11, wherein the meter is a water meter and the resource is water.

19. The method of claim 11, wherein the piezoelectric flexural element projects perpendicularly from the inner wall into the resource.

20. A meter comprising:

an inlet;

an outlet;

a passageway between the inlet and the outlet; and a piezoelectric flexural element, wherein:

a first end of the piezoelectric flexural element is affixed to an inner wall of one of the inlet, the outlet, or the passageway, the piezoelectric flexural element is configured to output an electrical signal responsive to a change in flow rate of a resource traversing the inlet, the passageway, and the outlet, and the piezoelectric flexural element is enclosed in a check valve.

21. The meter of claim 20, wherein the change in the flow rate comprises a transition from a zero flow rate to a greater-than-zero flow rate.

* * * * *